United States Patent [19]

Brown

[11] 4,413,308
[45] Nov. 1, 1983

[54] PRINTED WIRING BOARD CONSTRUCTION

[75] Inventor: Vernon L. Brown, Boulder, Colo.

[73] Assignee: Bell Telephone Laboratories, Incorporated, Murray Hill, N.J.

[21] Appl. No.: 297,862

[22] Filed: Aug. 31, 1981

[51] Int. Cl.³ .............................................. H05K 1/14
[52] U.S. Cl. .................................. 361/398; 361/401; 361/403; 361/408; 357/80
[58] Field of Search ............... 361/398, 399, 401, 403, 361/421, 408; 357/70, 80

[56] References Cited

U.S. PATENT DOCUMENTS

| | | | |
|---|---|---|---|
| 3,344,900 | 10/1967 | Drop | 29/740 |
| 3,390,308 | 6/1968 | Marley | 361/401 X |
| 3,487,541 | 1/1970 | Boswell | 29/746 |
| 3,708,851 | 1/1973 | Vladik | 29/740 |
| 3,792,383 | 2/1974 | Knappenberger | 361/401 X |
| 3,864,728 | 2/1975 | Peltz et al. | 357/80 X |
| 3,875,478 | 4/1975 | Capstick | 361/398 X |
| 3,908,075 | 9/1975 | Jackson et al. | 361/401 X |
| 3,930,115 | 12/1975 | Uden et al. | 357/81 X |
| 4,007,479 | 2/1977 | Kowalski | 361/403 X |
| 4,042,861 | 8/1977 | Yasuda et al. | 361/398 X |
| 4,084,315 | 4/1978 | Michaels | 29/740 |

Primary Examiner—R. R. Kucia
Attorney, Agent, or Firm—W. H. Kamstra

[57] ABSTRACT

A mounting arrangement for an integrated circuit leadless chip carrier (13) for providing compliance to prevent solder joint failures due to stress and differential thermal expansion. A supporting substrate board (10, 20, 30) has bonded to one surface a flexible sheet (11) carrying printed wiring (12) to which the carrier (13) is electrically connected by means of solder pedestals (19). At each of the latter connections the board (10, 20, 30) presents recesses (15, 22, 31a, 33a) over which the sheet (11) is freely suspended to provide free sheet portions (18) which absorb the stress and differential expansion to protect the solder connections.

17 Claims, 8 Drawing Figures

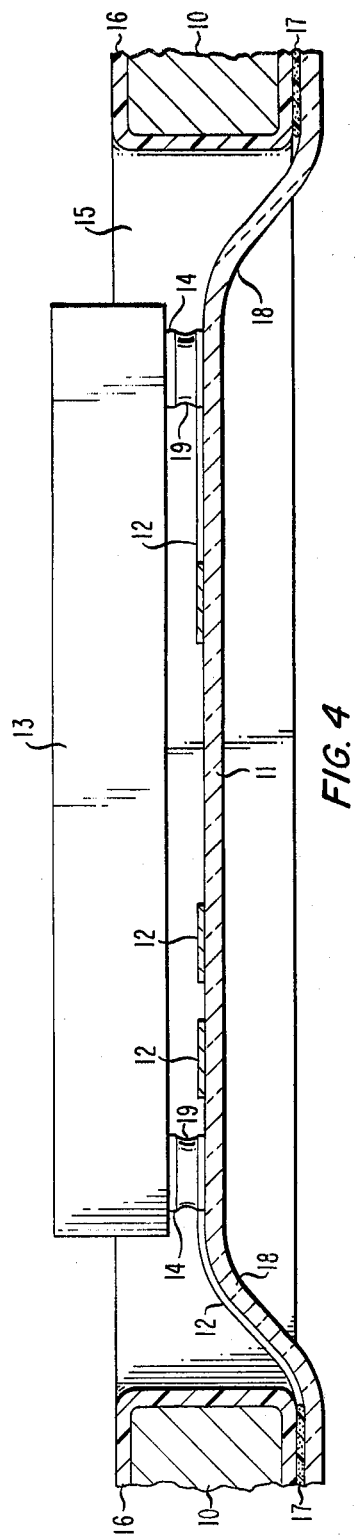
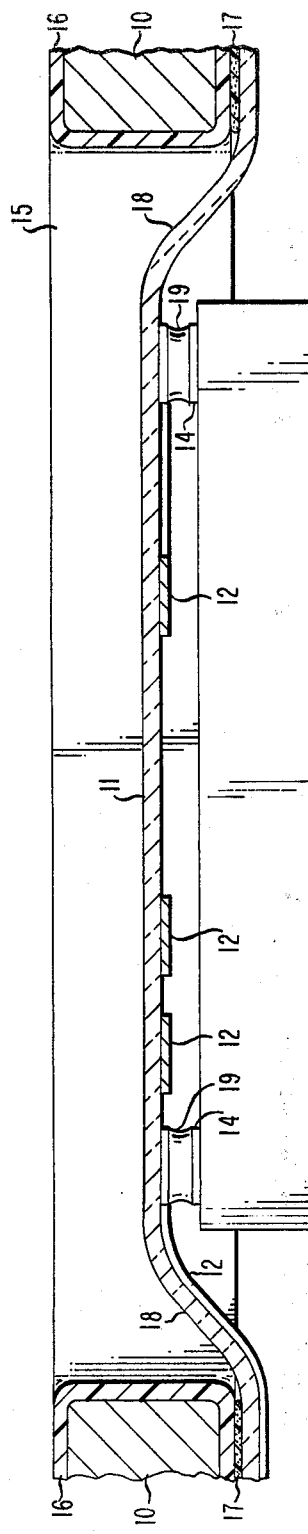

PRINTED WIRING BOARD CONSTRUCTION

TECHNICAL FIELD

This invention relates to printed wiring board constructions and particularly to arrangements for mounting thereon integrated circuit chips and the like.

BACKGROUND OF THE INVENTION

Printed wiring boards with their mounted circuit components together with their mounting frames are well known and have long provided an advantageous means for assembling in an organized and ordered fashion in an electronics system, large numbers of electrical circuits. Generally, such boards have been adapted to carry integrated circuit chips as well as larger circuit components such as those referred to as dual, in-line circuit packs. In the past, when circuit chips are to be mounted on the board, the chip is first mounted on a chip carrier which is then electrically connected to the board wiring, either by means of terminal pins inserted in board sockets or by leads soldered to the board wiring. The socket or leads provide the compliance necessary to prevent solder joint failures which may result from excessive stresses produced when the board is flexed either in manufacture or use, for example. Such stresses may also be applied by the differential expansion of the epoxy-glass board substrate and the ceramic material of the chip carrier when the board assembly is temperature cycled in normal use.

A conventional printed wiring board also presents varying degrees of warp created either by manufacturing processes or as an inherent characteristic of the board raw material. As a result, when a warped, assembled printed wiring board is inserted in its mounting frame, it may be forcibly straightened thereby causing relatively large stresses to be applied to the electrical connections of the components mounted on the board. Too, craftspersons may attempt the manual straightening of a warped board before inserting it in its frame, thereby bringing about the same stresses on the electrical connections. In these circumstances, as one approach to the problem, chip carrier leads and sockets have also, in the past, provided the required compliance with these stresses to prevent damage to the electrical connections.

Another approach to the compliance problem in the past has been to apply a small pillar or pedestal of solder to each of the terminal pads of the chip carrier. When the carrier is subsequently mounted on the printed wiring board in a suitable solder flux and the pillars reflowed, a solder connection is formed which is relied upon to absorb the aforementioned stresses. This approach has its own disadvantages. The control of the solder reflow required to produce acceptable pillars has been difficult to achieve. The application of the solder pillars also adds significantly to the cost of the chip carrier. Further, because the melting point of the solder is lower than the temperature required for the sealing operation of the chip carrier, the solder application can only be accomplished during device manufacture at some time after the sealing operation. This adds further to the cost of the fabrication of the chip carrier since completed batches of the carrier would be discarded in the event of a single defective solder application.

It is thus an objective of the printed wiring board construction of the invention to provide a new and novel circuit chip mounting arrangement for achieving stress compliance directed to the foregoing and other problems.

SUMMARY OF THE INVENTION

The foregoing and other objectives are realized in one illustrative integrated circuit chip mounting arrangement according to the invention in which a circuit board is recessed at least in an area where a solder connection is to be made between a chip carrier terminal and the board printed wiring. The latter wiring is carried by an insulative, flexible tape or sheet secured on the board by a suitable adhesive and is permitted to dip slightly into the recessed area or areas. At the chip carrier and wiring solder connections, any differential stresses between the carrier and the board occurring for whatever reason are absorbed by the flexible circuitry at the connection points. For example, contraction or expansion of the board simply causes a slight straightening or further curvature, respectively, of the slack flexible circuitry within the board recess or recesses. The possibility of solder joint failures during handling or use of the board is thus significantly reduced.

BRIEF DESCRIPTION OF THE DRAWING

The organization of an integrated circuit mounting arrangement according to the principles of the invention together with its features will be better understood from a consideration of the detailed description of illustrative embodiments thereof which follows when taken in conjunction with the accompanying drawing in which:

FIG. 4 is an enlarged section view of the construction portion depicted in FIG. 2 taken along the line 4—4;

FIG. 5 is the same view as that of FIG. 4 with the difference that an alternate manner of mounting a chip carrier is shown;

DETAILED DESCRIPTION

Figure 1:
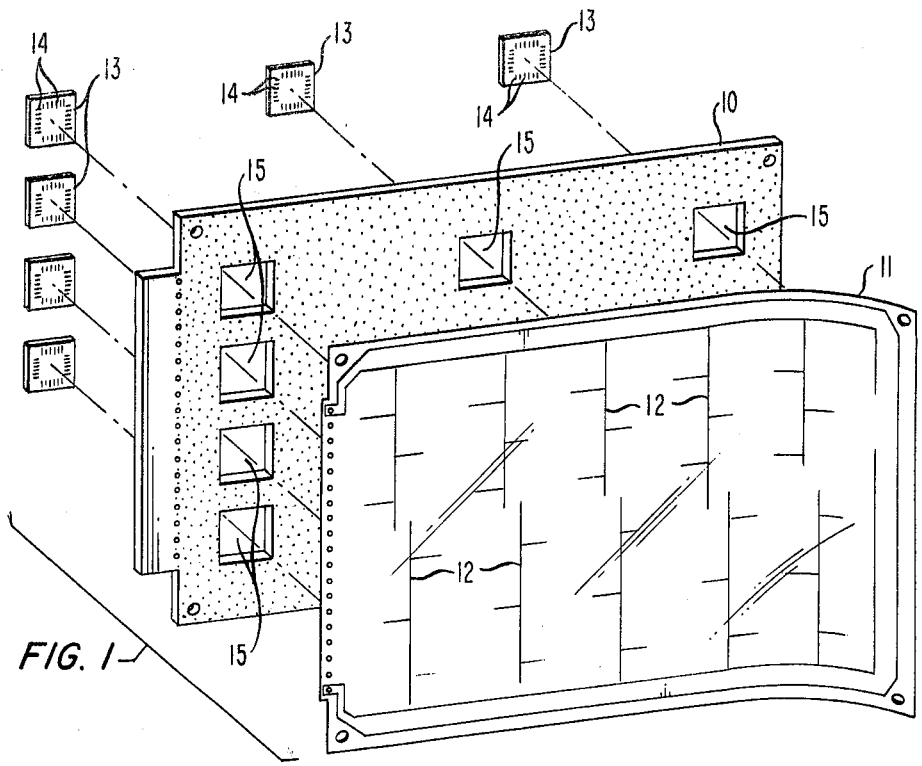
FIG. 1 is an exploded, perspective view of a substrate board, a flexible wiring overlay, and a number of representative integrated circuit chip carriers which comprise components of the mounting arrangement according to the invention.
Figure 2:
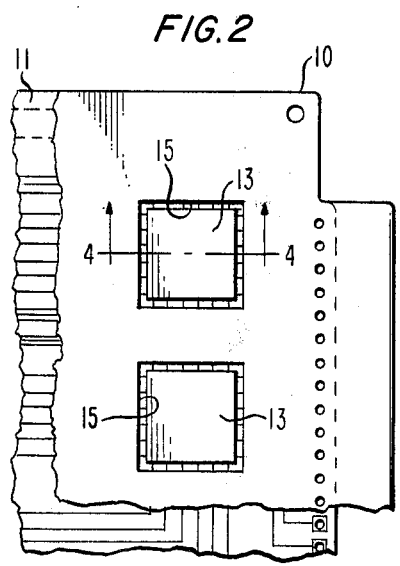
FIG. 2 depicts an enlarged portion of the construction of FIG. 1 as assembled as viewed from the rear of the latter figure.

Components of an illustrative integrated circuit chip carrier mounting arrangement according to the invention shown in exploded view in FIG. 1 include a substrate supporting board 10 of any suitable hard material which here is assumed as metallic and a flexible sheet 11 carrying various electrical conducting patterns 12 to which the chip carriers 13 ultimately will be electrically connected. Chip carriers 13 are well known in the art as leadless and are provided with rows of electrical terminals 14 arranged about their peripheries on the underside. Carriers 13 are shown in FIG. 1 as arranged in a representative pattern for their connections to the conductors of flexible printed wiring sheet 11 at corresponding positions. At corresponding positions in supporting board 10, a plurality of substantially rectangular apertures 15 is presented, which apertures are dimensioned somewhat larger than the outside dimensions of rectangular carriers 13. The assembly and electrical interconnections of the components so far considered are better seen from the enlarged portional view of FIG. 2 and the enlarged sectional view of FIG. 4. FIG. 2 shows a portion of the assembly viewed from the rear of supporting board 10 showing two representative chip carriers 13 in places within apertures 15 of board 10. The section view of FIG. 4 shows a portion of metallic board 10 sectioned at an aperture 15. Board 10, in the illustrative assembly being described, is faced on its exposed surfaces with an insulative layer 16 and flexible printed wiring sheet 11 is affixed to layer 16 across aperture 15 by means of a suitable adhesive layer 17. In its span of aperture 15, sheet 11 is slightly offset into aperture 15 as indicated by the exaggerated indentation in the tape in FIG. 4 to present a slight rim 18 extending around and within the periphery of aperture 15. In the embodiment of FIG. 4, printed wiring 12 of sheet 11 is affixed thereon on its upper side as viewed in the figure to which wiring the leadless terminals 14 of chip carriers 13 are electrically connected by means of solder pedestals 19.

In FIG. 5 is shown an enlarged portion of the construction of the invention substantially identical to that of FIG. 4 with the difference that chip carrier 13 is mounted on the underside of printed wiring sheet 11 as viewed in this figure, the same reference characters being used to designate identical elements. In either case, a thermal expansion or contraction of board 10 will cause only a slight downward or upward displacement of carrier 13 within aperture 15 without placing strain on solder pedestals 19. Thus, if thermal conditions cause a shrinkage of board 10, the walls of aperture 15 will close slightly inward thereby causing a contraction of sheet 11 which is taken up by the free rim 18. Similarly, if board 10 expands, aperture 15 enlarges slightly, causing sheet 11 to be stretched slightly across aperture 15 which lengthening is again taken up by the free rim 18 of sheet 11. Any warpage or bending of board 10 will also be absorbed by free rim 18 of sheet 11 to protect the solder connections.

Figure 3:
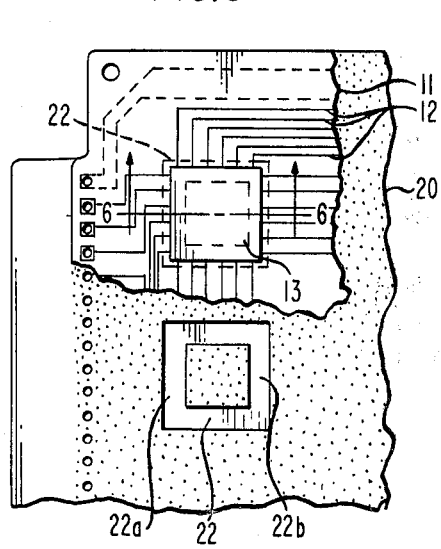
FIG. 3 similarly depicts an enlarged portion of the construction of FIG. 1 as assembled as viewed from the forefront of the latter figure.
Figure 6:
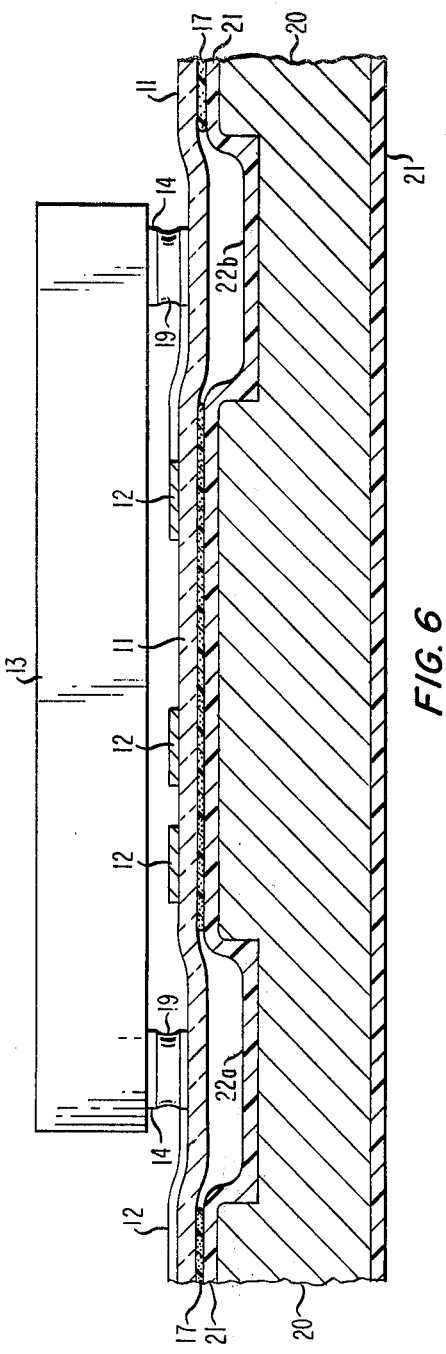
FIG. 6 is an enlarged section view of the construction portion depicted in FIG. 3 taken along the line 6—6 in which portion recesses are provided in the substrate board at the points of carrier connections.

In FIG. 3 and its enlarged section view of FIG. 6 is shown another illustrative chip mounting arrangement according to the principles of the invention in which recesses are provided in the supporting board instead of complete apertures to achieve compliance. In FIG. 3, where the same reference characters are employed to designate elements identical to those already described, a portion of a printed wiring flexible sheet 11 is shown on a larger portion of support board 20 to which sheet 11 is affixed by any suitable adhesive. Board 20, like board 10 of the previous figures, is formed of a suitable metallic material and is faced with an insulative layer 21. Sheet 11 is affixed to the upper surface of board 20 by means of a suitable adhesive layer 17 (FIG. 6) and chip carrier 13 has its leadless terminals 14 again electrically connected to the wiring 12 of sheet 11 by means of solder pedestals 19. Board 20 is again recessed at the latter connections but here, as a variant of the novel arrangement of the invention, the recess is provided only at the points of connection. Thus, for example, as shown in FIG. 3, a rectangular channel 22 is presented in board 20 at each chip carrier location, the outer dimensions of channel 22 being somewhat larger than the outer dimensions of chip carrier 13. Two legs 22a and 22b of channel 22 are shown enlarged in the section view of FIG. 6. The width of channel 22 is determined so that the chip carrier solder connections are made substantially centrally in the width of the channel. As sheet 11 spans each leg of rectangular channel 22 it is slightly depressed into the channel to form two free sheet 11 portions about the entire channel, one on each side of the carrier solder connections. Compliance is achieved in the embodiments of FIGS. 3 and 6 in a manner identical to that described for the embodiment of FIGS. 1, 2, 4, and 5. Any differential change in the dimensions of chip carrier 13 and board 20 as well as strains due to handling are absorbed by the aforementioned free sheet portions.

Figure 7:
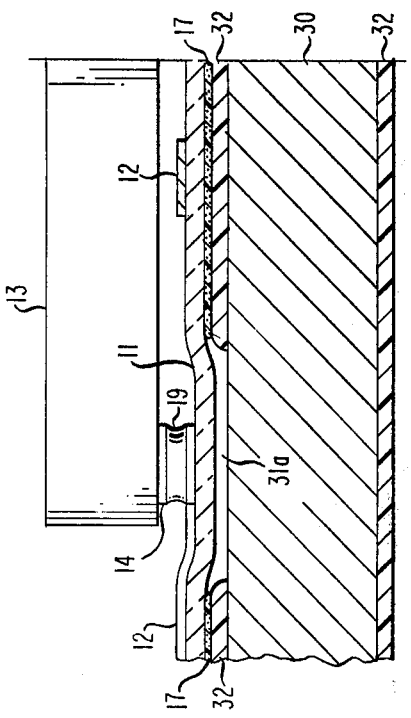
FIG. 7 is an enlarged section view of the mounting arrangement according to the invention depicting an alternate means for achieving the substrate board recesses shown in FIG. 6.

Another illustrative arrangement according to the invention for achieving compliance in chip carrier mounting is shown only in the enlarged portional section view of FIG. 7. In this arrangement, the surface of metallic support board 30 remains even and a rectangular channel, on leg 31a of which is shown, is formed by an interruption of the required dimensions in the insulative layer 32 facing the exposed surfaces of board 30. Printed wiring flexible sheet 11 secured to layer 32 by adhesive 17, spans the channel legs, including leg 31a, again presenting free sheet portions for providing compliance.

Figure 8:
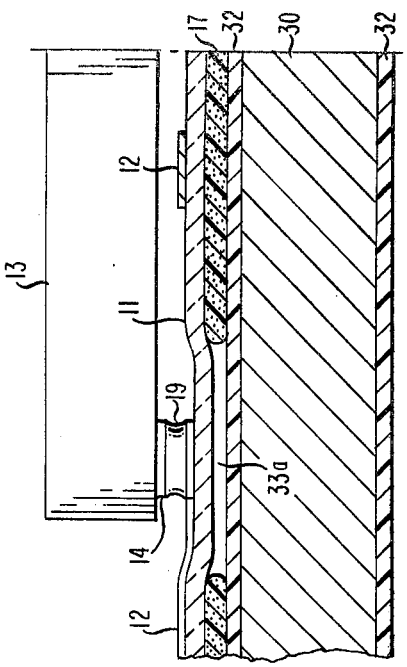
FIG. 8 is an enlarged section view of the mounting arrangement according to the invention depicting still another means for achieving the substrate board recesses shown in FIG. 7.

In FIG. 8 is shown still another arrangement for achieving a recess across which the flexible sheet and its chip carrier connection may be suspended. In this arrangement, depicted only in a portional section view, supporting board 30 and its insulative layer 32 remain continuous and unbroken. A rectangular channel, one leg 33a of which is shown, is formed by an interruption of the required dimensions in a thicker layer 34 of the adhesive which bonds sheet 11 on the surface of board 30. The latter sheet spans the channel legs to suspend the solder pedestals 19 thereacross, again presenting free sheet portions for providing compliance.

As mentioned hereinbefore, the illustrative chip carrier arrangements described may advantageously be employed to achieve interconnection compliance on supporting boards on which other electrical components such as dual in-line circuit packs are also mounted. It will further be understood that what have been described are considered to be only illustrative carrier mounting arrangements according to the principles of the invention. Accordingly, various and numerous other arrangements may be devised by one skilled in the art without departing from the spirit and scope of the invention as defined only by the accompanying claims.

What is claimed is:

1. A printed wiring board construction comprising an electrical component having a pattern of electrical terminals thereon, a supporting substrate having a planar surface having a recess therein for each of said terminals and corresponding in position to the positions of said terminals in said pattern of terminals, and a flexible sheet carrying printed wiring affixed to said planar surface extending over said recess for each of said terminals, said sheet extending beneath the plane of said surface at said positions of said terminals, said terminals being electrically connected to said printed wiring within said recess for each of said terminals.

2. A printed wiring board construction as claimed in claim 1, in which each of said recesses is dimensioned larger than the peripheral dimensions of each of said terminals and extends through said supporting substrate.

3. A printed wiring board construction as claimed in claim 1, in which each of said recesses is formed to conform to said pattern of electrical terminals and extends partially in from said planar surface.

4. A printed wiring board construction as claimed in claim 3 in which said sheet is affixed to said substrate by an adhesive layer, said planar surface being presented by the outer face of said layer and in which said recesses are formed by an interruption in said layer.

5. A printed wiring board construction as claimed in claim 3 in which said electrical component comprises a leadless integrated circuit chip carrier.

6. A printed wiring board construction as claimed in claim 5 in which said electrical terminals are connected to said printed wiring by solder connections.

7. A printed wiring board construction as claimed in claim 4 in which said electrical component comprises a leadless integrated circuit chip carrier.

8. A printed wiring board construction as claimed in claim 7 in which said electrical terminals are connected to said printed wiring by solder connections.

9. A printed wiring board construction comprising a supporting substrate having a planar surface having a recess therein at each of a plurality of component mounting locations, an electrical component having a pattern of electrical terminals thereon for each of said locations, and a flexible sheet carrying printed wiring affixed to said planar surface extending over said recess at each of said plurality of locations, said sheet extending beneath the plane of said surface at said recess at each of said locations, said terminals being electrically connected to said printed wiring within said recess at each of said locations.

10. A printed wiring board construction as claimed in claim 9 in which each of said recesses is dimensioned larger than the peripheral dimensions of each of said electrical components and extends through said supporting substrate.

11. A printed wiring board construction as claimed in claim 9 in which each of said recesses is formed to conform to said pattern of electrical terminals and extends partially in from said planar surface.

12. A printed wiring board construction as claimed in claim 11 in which said sheet is affixed to said substrate by an adhesive layer, said planar surface being presented by the outer face of said layer and in which said recesses are formed by an interruption in said layer.

13. A printed wiring board construction as claimed in claim 11 in which each of said electrical components comprises a leadless integrated circuit chip carrier.

14. A printed wiring board construction as claimed in claim 13 in which said electrical terminals are connected to said printed wiring by solder connections.

15. A printed wiring board construction as claimed in claim 12 in which each of said electrical components comprises a leadless integrated circuit chip carrier.

16. A printed wiring board construction as claimed in claim 15 in which said electrical terminals are connected to said printed wiring by solder connections.

17. A printed wiring board construction comprising an electrical component having a pattern of electrical terminals thereon, a supporting substrate having a planar surface, said surface being recessed at said pattern of terminals, and a flexible sheet carrying printed wiring affixed to said planar surface, said sheet extending slightly beneath the plane of said surface where said surface is recessed, said pattern of electrical terminals being electrically connected to said printed wiring where said sheet extends beneath said plane of said surface.

* * * * *